United States Patent
Kotani et al.

(10) Patent No.: US 7,194,704 B2
(45) Date of Patent: Mar. 20, 2007

(54) DESIGN LAYOUT PREPARING METHOD

(75) Inventors: Toshiya Kotani, Machida (JP); Shigeki Nojima, Yokohama (JP); Suigen Kyoh, Yokohama (JP); Kyoko Izuha, Yokohama (JP); Ryuji Ogawa, Yokohama (JP); Satoshi Tanaka, Kawasaki (JP); Soichi Inoue, Yokohama (JP); Hirotaka Ichikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 11/012,491

(22) Filed: Dec. 16, 2004

(65) Prior Publication Data

US 2005/0204322 A1   Sep. 15, 2005

(30) Foreign Application Priority Data

Dec. 17, 2003   (JP)   .............................. 2003-419601

(51) Int. Cl.
*G06F 17/50* (2006.01)
*G06F 9/45* (2006.01)
*G06F 9/455* (2006.01)

(52) U.S. Cl. .................... 716/2; 716/4; 716/5; 716/11; 716/21

(58) Field of Classification Search ................ 716/1–2, 716/4–5, 21, 11
See application file for complete search history.

(56) References Cited

U.S. PATENT DOCUMENTS

| | | | |
|---|---|---|---|
| 6,507,931 B2 | 1/2003 | Kotani et al. | |
| 6,576,147 B2 | 6/2003 | Mukai | |
| 2003/0093767 A1* | 5/2003 | Murai et al. | 716/21 |
| 2003/0115569 A1* | 6/2003 | Ikeuchi | 716/19 |
| 2004/0015794 A1* | 1/2004 | Kotani et al. | 716/4 |

FOREIGN PATENT DOCUMENTS

| | | |
|---|---|---|
| JP | 2002-026126 | 1/2002 |
| JP | 2002-131882 | 5/2002 |
| JP | 2003-303742 | 10/2003 |

* cited by examiner

*Primary Examiner*—Paul Dinh
*Assistant Examiner*—Suresh Memula
(74) *Attorney, Agent, or Firm*—Finnegan, Henderson, Farabow, Garrett & Dunner, L.L.P.

(57) ABSTRACT

There is disclosed a method of producing a design layout by optimizing at least one of design rule, process proximity correction parameter and process parameter, including calculating a processed pattern shape based on a design layout and a process parameter, extracting a dangerous spot having an evaluation value with respect to the processed pattern shape, which does not satisfy a predetermined tolerance, generating a repair guideline of the design layout based on a pattern included in the dangerous spot, and repairing that portion of the design layout which corresponds to the dangerous spot based on the repair guideline.

16 Claims, 6 Drawing Sheets

| Category | Width lower limit | Width upper limit | Space lower limit | Space upper limit | Line Sizing | Space Sizing | Priority | Lithography error |
|---|---|---|---|---|---|---|---|---|
| Open | 90 | 110 | 90 | 110 | +0.010 | +0.010 | 120 | 80 |
| Open | 90 | 110 | 110 | 130 | +0.010 | +0.005 | 120 | 80 |
| Open | 90 | 110 | 130 | 150 | +0.010 | -0.010 | 120 | 80 |
| Open | 90 | 110 | 150 | 170 | +0.015 | -0.015 | 120 | 80 |
| Open | 90 | 110 | 170 | 190 | +0.020 | -0.020 | 120 | 80 |
| Open | 90 | 110 | 190 | 210 | +0.020 | -0.020 | 120 | 80 |
| Open | 90 | 110 | 210 | Big | +0.020 | -0.020 | 120 | 80 |
| Open | 110 | 130 | 90 | 110 | +0.010 | +0.005 | 120 | 80 |
| Open | 110 | 130 | 110 | 130 | +0.010 | +0.000 | 120 | 80 |
| Open | 110 | 130 | 130 | 150 | +0.010 | -0.010 | 120 | 80 |
| Open | 110 | 130 | 150 | 170 | +0.015 | -0.015 | 120 | 80 |
| Open | 110 | 130 | 170 | 190 | +0.020 | -0.020 | 120 | 80 |
| Open | 110 | 130 | 190 | 210 | +0.020 | -0.020 | 120 | 80 |
| Open | 110 | 130 | 210 | Big | +0.020 | -0.020 | 120 | 80 |
| Open | 130 | 150 | 90 | 110 | +0.010 | +0.005 | 120 | 80 |
| Open | 130 | 150 | 110 | 130 | +0.010 | +0.000 | 120 | 80 |
| Open | 130 | 150 | 130 | 150 | +0.010 | -0.010 | 120 | 80 |
| Open | 130 | 150 | 150 | 170 | +0.010 | -0.010 | 120 | 80 |
| Open | 130 | 150 | 170 | 190 | +0.010 | -0.010 | 120 | 80 |
| Open | 130 | 150 | 190 | 210 | +0.015 | -0.015 | 120 | 80 |
| Open | 130 | 150 | 210 | Big | +0.015 | -0.015 | 120 | 80 |

F I G. 8

DESIGN LAYOUT PREPARING METHOD

CROSS-REFERENCE TO RELATED APPLICATIONS

This application is based upon and claims the benefit of priority from the prior Japanese Patent Application No. 2003-419601, filed Dec. 17, 2003, the entire contents of which are incorporated herein by reference.

BACKGROUND OF THE INVENTION

1. Field of the Invention

The present invention relates to design layout preparing method and system for preparing a design pattern of a semiconductor integrated circuit.

2. Description of the Related Art

Recently, the technique of manufacturing semiconductor devices has remarkably advanced, and semiconductor devices having a minimum process dimension of 0.13 μm are mass-produced. The scale-down described above is realized by the great development of micro-pattern forming techniques such as mask-process techniques, photolithography techniques and etching techniques.

In the large pattern size generation, an LSI pattern to be formed on a wafer is intactly used as a design pattern, and a mask pattern faithful to the design pattern is produced. The mask pattern is transferred onto the wafer using a projection optical system, thereby forming a pattern approximately equal to the design pattern on the wafer.

However, the scale-down of the pattern advances; for this reason, it is difficult to faithfully form a pattern in individual processes. As a result, a problem arises such that the final processed pattern shape is not provided as the design pattern.

In order to overcome the foregoing problem, so-called mask data processing is very important. More specifically, a mask pattern different from the design pattern is produced so that the final processed pattern dimensions become approximately equal to the design pattern.

The mask data processing includes the following processings. One is MDP processing of modifying the mask pattern using graphical operation and a design rule checker (D.R.C.). Another is optical proximity correction (OPC) for correcting the optical proximity effect (OPE). The foregoing processings are made, and thereby, the mask pattern is properly corrected so that the final processed pattern dimensions are provided as desired dimensions.

In recent years, a k1 value (k1=W/(NA/λ)) becomes smaller and smaller in the lithography process with the scale-down of device patterns. (In the foregoing equation, W: design pattern dimension, λ: exposure wavelength of exposure system, and NA: numerical aperture of a lens used for the exposure system.) As a result, there is a tendency for the influence by the OPE to increase. For this reason, a very heavy load is given to the OPC.

In order to achieve high accuracy of the OPC, a model-based OPC is mainly employed. According to the model-based OPC, a proper correction value for each mask pattern is calculated using a light intensity simulator capable of accurately predicting the OPE. With a decrease of the k1 value, a design rule (DR) closely relating with the OPC becomes complicated; for this reason, the layout securing method using the DR is liable to collapse.

Recently, a new system (called Design for Manufactubility: DfM) for securing the layout is required, and various proposals to realize the new system have been made. For example, there has been proposed a layout preparing and securing method using the following system (e.g., JPN. PAT. APPLN. KOKAI Publication No. 2002-26126 and No. 2003-303742). The system is composed of a compaction tool, OPC tool, lithography simulator and dangerous pattern (a pattern having a small process margin) analysis tool.

However, even if the foregoing method is employed, it is difficult to obtain the optimum layout having a minimum layout area without dangerous patterns.

As described above, the k1 value decreases in the lithography process, and thereby, layout securement using the design rule is collapsing. In addition, a new system (DfM) for securing the layout has been proposed. However, even if the proposed new system is used, it is difficult to obtain the optimum layout having a minimum layout area without dangerous patterns.

BRIEF SUMMARY OF THE INVENTION

According to a first aspect of the present invention, there is provided a method of producing a design layout by optimizing at least one of design rule, process proximity correction parameter and process parameter, comprising: calculating a processed pattern shape based on a design layout and a process parameter; extracting a dangerous spot having an evaluation value with respect to the processed pattern shape, which does not satisfy a predetermined tolerance; generating a repair guideline of the design layout based on a pattern included in the dangerous spot; and repairing that portion of the design layout which corresponds to the dangerous spot based on the repair guideline.

According to a second aspect of the present invention, there is provided a system for producing a design layout by optimizing at least one of design rule, process proximity correction parameter and process parameter, comprising: a calculating part calculating a processed pattern shape based on a design layout and a process parameter; an extracting part extracting a dangerous spot having an evaluation value with respect to the processed pattern shape, which does not satisfy a predetermined tolerance; a generating part generating a repair guideline of the design layout based on a pattern included in the dangerous spot; and a repairing part repairing that portion of the design layout which corresponds to the dangerous spot based on the repair guideline.

According to a third aspect of the present invention, there is provided a computer readable medium configured to store program instructions applied to producing a design layout by optimizing at least one of design rule, process proximity correction parameter and process parameter, the program instructions causing a computer to calculate a processed pattern shape based on a design layout and a process parameter; causing a computer to extract a dangerous spot having an evaluation value with respect to the processed pattern shape, which does not satisfy a predetermined tolerance; causing a computer to generate a repair guideline of the design layout based on a pattern included in the dangerous spot; and causing a computer to repair that portion of the design layout which corresponds to the dangerous spot based on the repair guideline.

DETAILED DESCRIPTION OF THE INVENTION

Embodiments of the present invention will be described below with reference to the accompanying drawings.

(First Embodiment)

Figure 1:
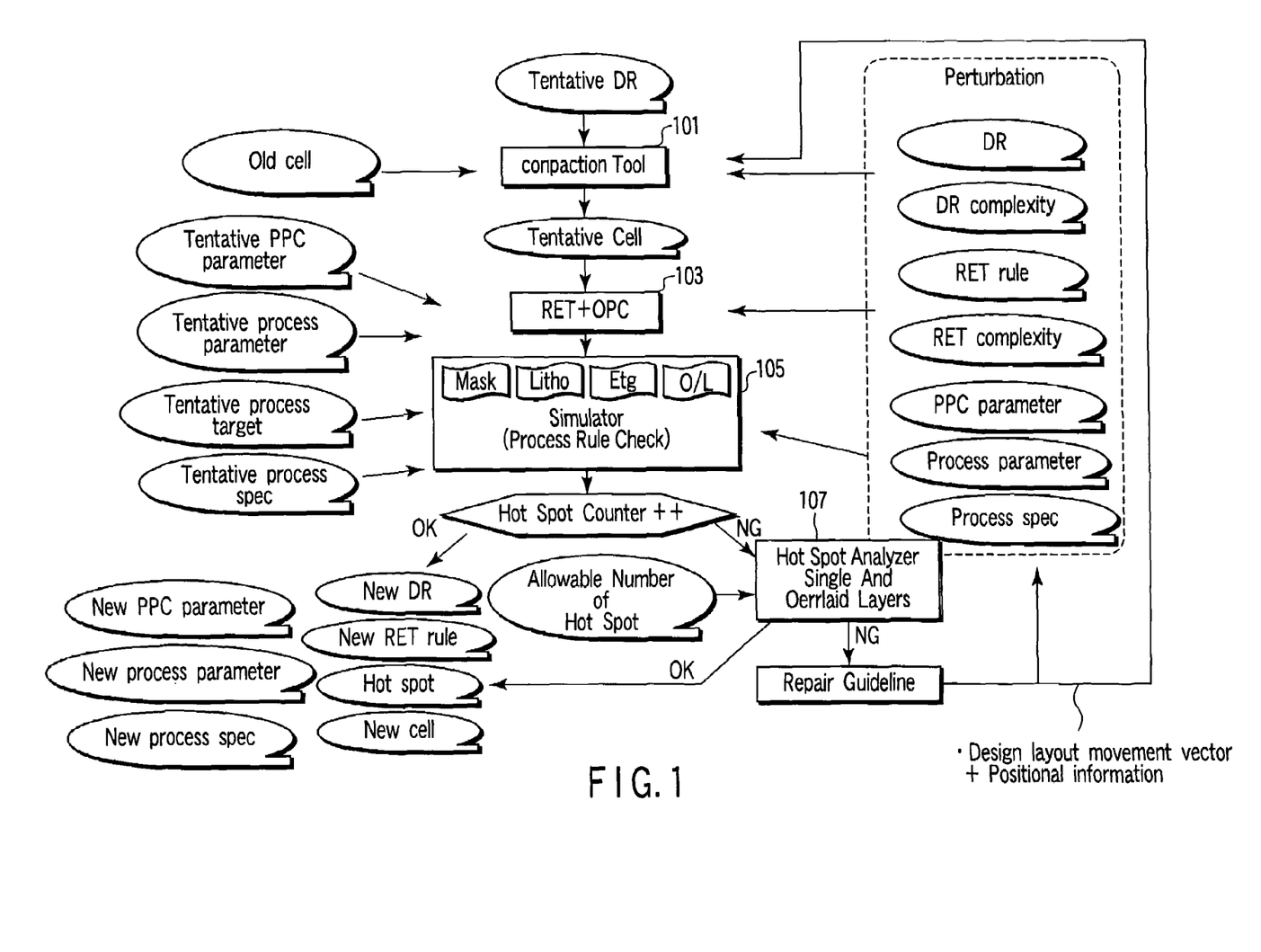
FIG. 1 is a flowchart to explain a design layout preparing method according to a first embodiment of the present invention.

FIG. 1 is a flowchart to explain the flow of a design layout preparing method according to a first embodiment of the present invention.

Tentative design rule and layout data are input to a compaction tool 101. In this case, an old-generation standard cell (old cell) is used as layout data. The compaction tool 101 repairs the input layout data so as to satisfy a given design rule (DR). Thus, output layout data (tentative cell) is layout data satisfying the input DR.

A RET+OPC processing section 103 carries out RET (Resolution Enhancement Technique) processing applied to the foregoing generation with respect to the layout data. The RET processing includes pattern generation processing, pattern delete processing and pattern sort processing. More specifically, the RET processing includes the following processing. One is shifter pasting processing for giving light transmittance and phase to layout data. Another is auxiliary pattern (SRAF: sub-resolution assist feature) adding processing and dummy pattern generation processing for improving a lithography margin. Another is layer sort processing for making double exposure. Further, the RET processing includes processing for resizing a design pattern dimension according to a rule (e.g., described in JPN. PAT. APPLN. KOKAI Publication No. 2002-131882). All rules relating to the RET are shown as RET rule in FIG. 1.

OPC based on the given process condition is made with respect to the layout data after the RET processing. In this case, the OPC includes general MDP (Mask Data Processing) such as resizing and Boolean operation (processings such as AND, OR, NOT, XOR). If the OPC is carried out based on a rule, a resize rule of design pattern defined according to pattern width and space width between neighboring patterns is included. If the OPC is carried out based on a model, the following PPC parameters are included. The PPC parameters are exposure wavelength of exposure system, numerical aperture of lens, transmittance of lens, illumination shape, intensity distribution of illumination light and resist development process.

A simulator 105 carries out a simulation with respect to the mask design pattern prepared in the manner described above to calculate a processed pattern shape on a wafer. In this case, the simulation is carried out taking mask process, lithography process and etching process into consideration. The tentative process parameter given to the simulation includes parameters relevant to exposure system, lithography process, mask process and etching process. The parameter relevant to exposure system includes wavelength of illumination light, numerical aperture of lens, illumination shape. Further, the parameter relevant to exposure system includes intensity distribution of illumination light, aberration of lens, exposure dose on a wafer, focus position, light transmittance distribution of lens. The parameter relevant to lithography process includes a diffusion length of acid contained in resist. The parameter relevant to mask process includes variations of the mask pattern dimension resulting from the mask process. The parameter relevant to etching process includes variations of the pattern dimension resulting from the etching process.

A tentative process target is a target dimension in each process, which is obtained by estimating variations of a processed pattern dimension in each process. For example, if the target pattern dimension after etching is 100 nm, and dimensional variations are estimated as +10 nm resulting from the etching process, a process target in the lithography process before the etching process is 90 nm. If 90 nm is given as the target in the lithography process, the dimension after etching is 100 nm because +10 nm is added thereto considering process variations by etching. In each process, the process target value needs to be simultaneously input to the simulator.

A value based on the processed pattern shape obtained by the simulation is compared with the foregoing process target value. The difference (evaluation value) between the former and the latter is compared with a simultaneously input tolerance (process spec). For example, the difference (evaluation value) includes each difference in dimension, area and peripheral length between the target pattern shape and the processed pattern shape. A portion having the difference larger than the process spec is recognized as a dangerous spot (hot spot). In this case, a different process spec is allocated in accordance with various elements. The elements are layer (metal (interconnect) layer, gate layer, contact layer), pattern width, distance between neighboring patterns, pattern shape feature (e.g., pattern intrinsic shapes such as line end portion, pattern corner), etc. In general, the process spec of the gate layer is set more severely than that of the interconnect layer. The process spec of a shape similar to a line and space (L & S) shape is severely set. Conversely, the process spec of the corner neighborhood and the line end portion is loosely set.

After the hot spot is extracted, positional information of the hot spot and calculated difference are input to a hot spot analyzer 107. The hot spot analyzer 107 determines whether or not the total number of hot spots is within the allowable number of hot spots.

If it is determined that the total number of hot spots is very little, a mask pattern is produced based on the design layout set at that time. In this case, in the exposure process, the dimension control is strictly carried out in the hot spot. Simultaneously, the dimension control of mask and wafer is also strictly carried out so that a desired pattern is formed in the hot spot region. As described above, the dimension control is strictly carried out in the hot spot, and thereby, it is possible to form a pattern having a desired dimension. In this case, hot spot control is possible in mask and wafer processes; therefore, the hot spot information is transferred to the mask and wafer processes, and thereby, the layout preparation flow ends.

On the other hand, if the number of hot spots is more than the allowable number, feedback for reducing the hot spot is required. For example, parameters giving an influence to the number of hot spots are as follows. That is, DR, PPC (Process Proximity Correction including Optical Proximity Correction (OPC)) parameter, RET parameter, and process spec are given. The given DR and RET rule is further complicated (shown as DR Complexity, RET complexity in FIG. 1) to carry out a complicated RET processing, and thereby, it is possible to reduce the number of hot spots. However, when layout repair portions to be modified are reduced to some portions, the foregoing method is employed, and thereby, the distribution of hot spots is dynamically variable. For this reason, the chip area must be made large, and the DR and RET rule must be complicated for some patterns only.

Figure 2:
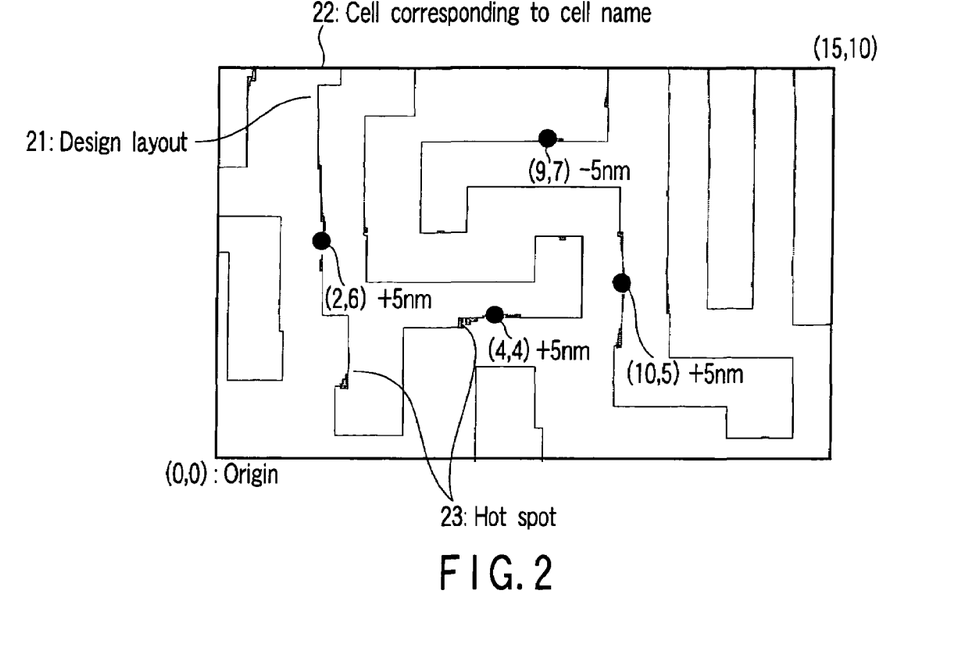
FIG. 2 is a view showing an output example of a design layout repair guideline based positional information and difference information of dangerous (hot) spot.

So, the repair guideline is generated based on the positional information input to the analyzer 107 and the difference between the target dimension and the processed pattern dimension in the hot spot. For example, a repair guideline showing repair portions, amount and direction in the design layout is generated. FIG. 2 shows an example of the repair guideline.

In FIG. 2, reference numeral 21 denotes a design layout, 22 denotes a cell corresponding to a cell name, and 23 denotes a hot spot. Further, spots having a small process margin are shown by micro graphics on a design pattern, and coordinates corresponding to the foregoing spots, target pattern and edge repair amount are shown. Incidentally, the coordinates of the start and termination points of the edge to be repaired may be defined, and the coordinates of repair target regions may be defined.

Figure 8:
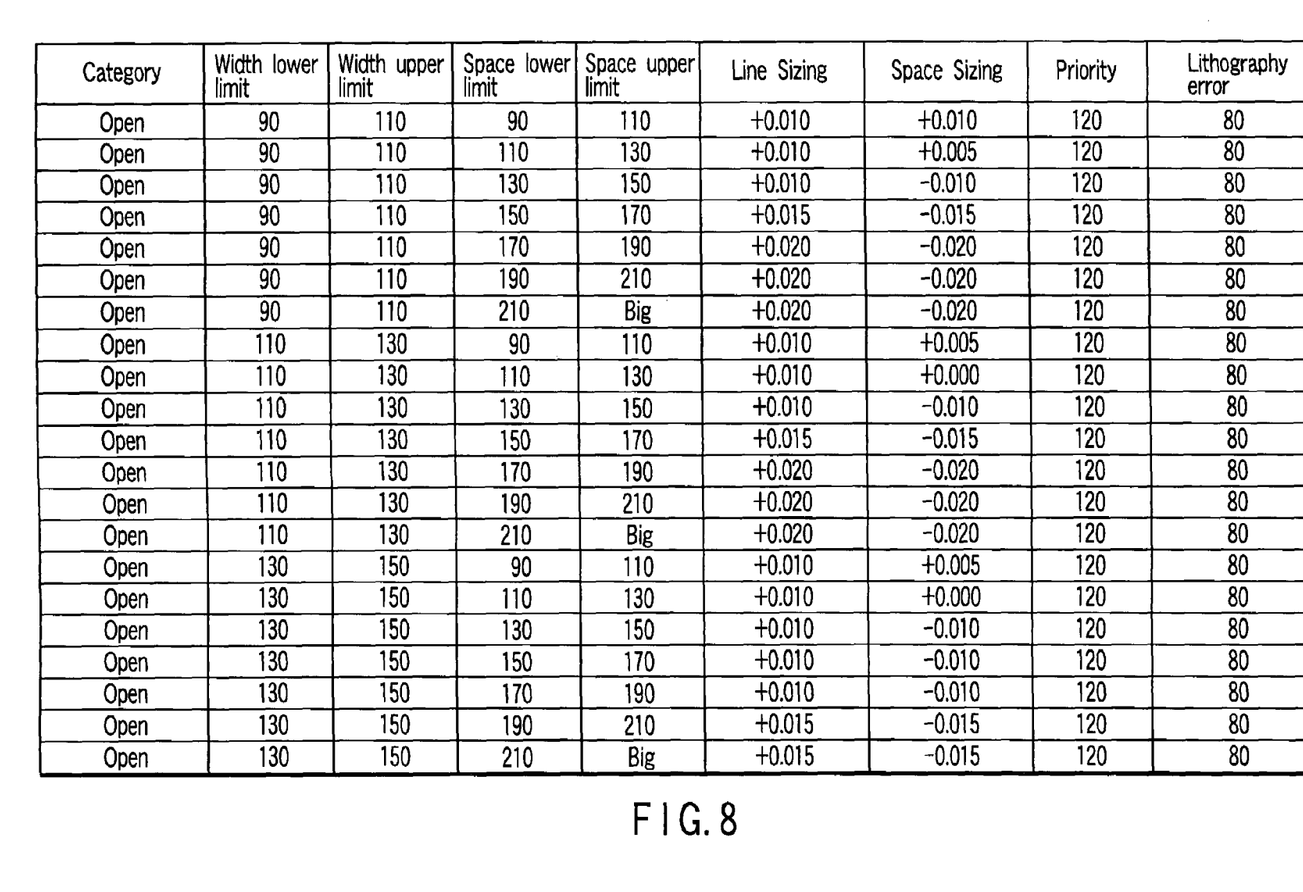
FIG. 8 is a view showing a rule table for determining correction.

The foregoing repair amount is previously set in a rule table (see FIG. 8) in accordance with the following elements. The elements include design pattern shape (layout shape such as line tip end and corner), design pattern width, space width between neighboring design patterns or error on a wafer predicted in a target spot. The design pattern shape, pattern width or space width of the spot having a small process margin are extracted. Thereafter, the extracted information is collated with the rule table, and thereby, the repair amount of the foregoing spot can be obtained.

The repair amount is mathematized as a function of the pattern information (design pattern shape, pattern width, space width, assumed error on a wafer). Then, the repair amount may be determined using the mathematical equation. One example of the foregoing case will be described below with reference to FIG. 9.

Figure 9:
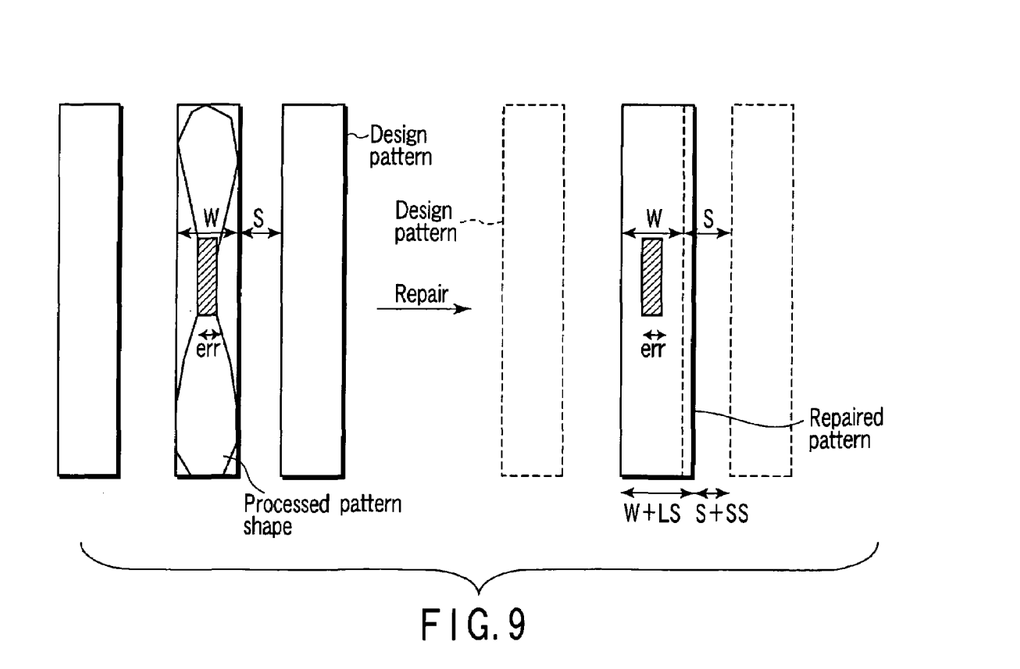
FIG. 9 is a view to explain the case of determining correction using a mathematical equation.

The repair amount (Line sizing) LS of the pattern width (line width) of the design pattern and the repair amount (Space Sizing) SS of the space width thereof are determined in the following manner using W, S and err. In this case, W is the pattern width of the design pattern, S is the space width thereof, and err is the error width of lithography image. The repair amounts LS and SS are a repair amount (repair width) with respect to the original design pattern.

If the pattern width on the wafer is formed narrower than the pattern width of the design pattern, the repair amounts LS and SS are expressed as follows.

When W<S, $LS=[(w-err)/2.0]/\text{coefficient}$ $SS=[(w-err)/2.0]/\text{coefficient}\times(-1)$ When W>=S, $LS=[(w-err)/2.0]/\text{coefficient}$ $SS=0$ In this case, SS=0 shows that the space width is not repaired. In other words, this means maintaining the space width of the original design pattern. The value of the foregoing coefficient ranges from 1 to 2.

If the space width on the wafer is formed narrower than the space width of the design pattern, the repair amounts LS and SS are expressed as follows.

When W>S, $LS=[(w-err)/2.0]/\text{coefficient}\times(-1)$ $SS=[(w-err)/2.0]/\text{coefficient}$ When W<=S, $LS=0$ $SS=[(w-err)/2.0]/\text{coefficient}$ In this case, LS=0 shows that the pattern width is not repaired. In other words, this means maintaining the pattern width of the original design pattern. The value of the foregoing coefficient ranges from 1 to 2.

The foregoing mathematical equations are fundamental, and the repair amounts LS and SS may be determined using other various equations.

Priority is given to edge to be repaired in its layout, and repair may be made in order from edge having high priority. A repair method of describing how the layout should be repaired may be defined.

Figures 3A, 3B:
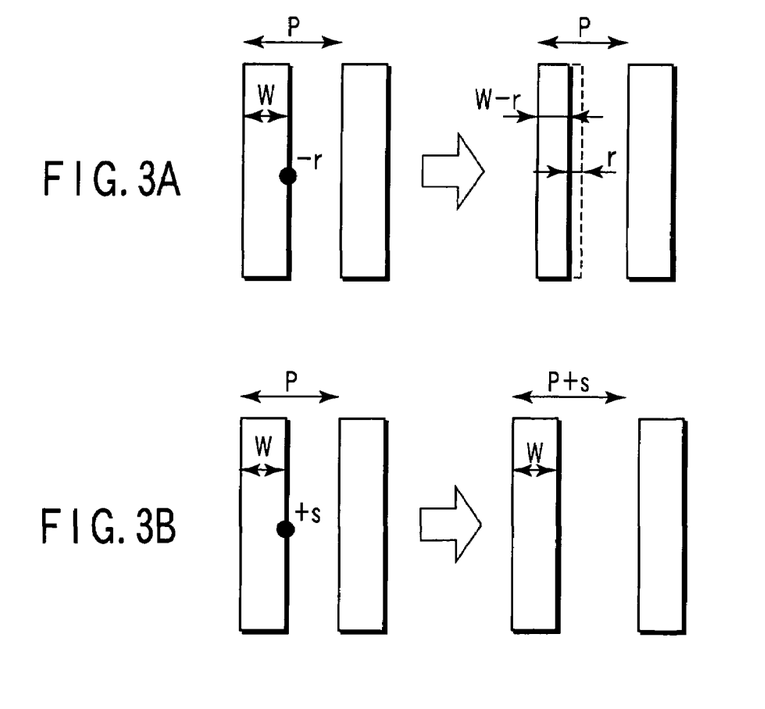
FIG. 3A and FIG. 3B are views to explain a correction method.

FIG. 3A and FIG. 3B are views to explain the foregoing repair method. As seen from FIG. 3A and FIG. 3B, two repair methods are given. In FIG. 3A and FIG. 3B, a black dot shows the position of hot spot, and −r and +r shows the repair amount and direction.

FIG. 3A shows a repair method using "resizing". In this case, a pattern pitch P is maintained before and after repair; however, repair is carried out so that a ratio of the pattern width and the pattern space changes. FIG. 3B shows a repair method using "shift". In this case, the pattern pitch changes; however, the pattern width W (or space width) is maintained before and after repair. The foregoing repair methods are output together with (the positional information+repair vector information), and then, may be used as input data of the compaction tool 101.

The following method may be given as a simple way. According to the method, the number of layout repair spots is set as a Cost function, and the flow is repeated so that the Cost function becomes minimum, and thereby, the layout repair is optimized.

Information output from the hot spot analyzer includes all information required for effectively making design layout repair in process simulation information for calculating DR, RET, OPC and evaluation value.

The compaction tool 101 changes the design pattern based on the design layout repair guideline described above. In this case, portions having instruction to repair layout are modified according to the repair instruction. Portions having no instruction to repair layout must be modified to satisfy the simultaneously input DR. In particular, if metal layer is repaired, the metal layer is repaired while contact layer must be properly repaired. If do not so, there is a possibility that a contact hole pattern is shifted from the metal pattern. In such a case, repair is made to satisfy DR defining the design layout dimensional relationship between metal layer and contact layer. Each processed pattern shape of several layers is calculated, and thereafter, the design layout may be properly repaired based on the calculated result. The layout prepared based on the design layout repair guideline does not necessarily satisfy the input DR. In this case, there is a possibility that it is determined that the processed pattern shape on a wafer has no problem.

The compaction tool 101 further carries out compaction so as not to make large the layout area as much as possible even if repair portions exists excluding the case of widening a critical path region. In the standard cell, the layout after repair needs to be placed on a given grid; therefore, compaction must be carried out so that the layout is not made larger than the grid. The compacted layout is compared with device circuit information, and thereafter, it may be verified whether or not compaction is correctly carried out. It may be verified whether or not the layout area is less than a predetermined area.

RET, OPC and simulation were again carried out with respect to the layout thus compacted. As a result, an increase of the layout area was less than 1% as compared with the layout area before repair, and the number of hot spots was reduced from 10 to 3. Thus, the flow is repeated, and thereby, the number of hot spots can be further reduced.

Mask formation, exposure and device formation were made using thus prepared DR, process parameter, RET, PPC parameter, process target, process spec, DR, design layout and mask pattern. As a result, it was confirmed that the hot spot was not observed on a wafer.

Incidentally, the final output includes design layout after repair, design layout after RET and layout after OPC. In addition, the final output includes RET rule, OPC rule, design rule and layout repair guideline rule. Further, the final output includes PPC parameter, PPC spec, process parameter and process target.

According to the first embodiment, the dangerous spot (hot spot) is extracted, and the design layout repair guideline is generated based on patterns included in the extracted dangerous spot. Then, a portion corresponding to the dangerous spot in the design layout is repaired based on the generated repair guideline. As described above, a portion corresponding to the extracted dangerous spot in the design layout are repaired. Therefore, it is possible to securely repair dangerous patterns without largely increasing the design layout area. In addition, the design layout repair guideline (positional information and vector information) for repairing dangerous patterns is generated. Then, the generated repair guideline is input to the design layout preparing tool to produce a new design layout. Consequently, it is possible to automatically produce a pattern layout having no (or few) dangerous pattern under the given process conditions without substantially increasing the layout area.

(Second Embodiment)

The pattern repair based on the flow described in the first embodiment was carried out with respect to an actual layout. The following is a description of the results.

Figure 4:
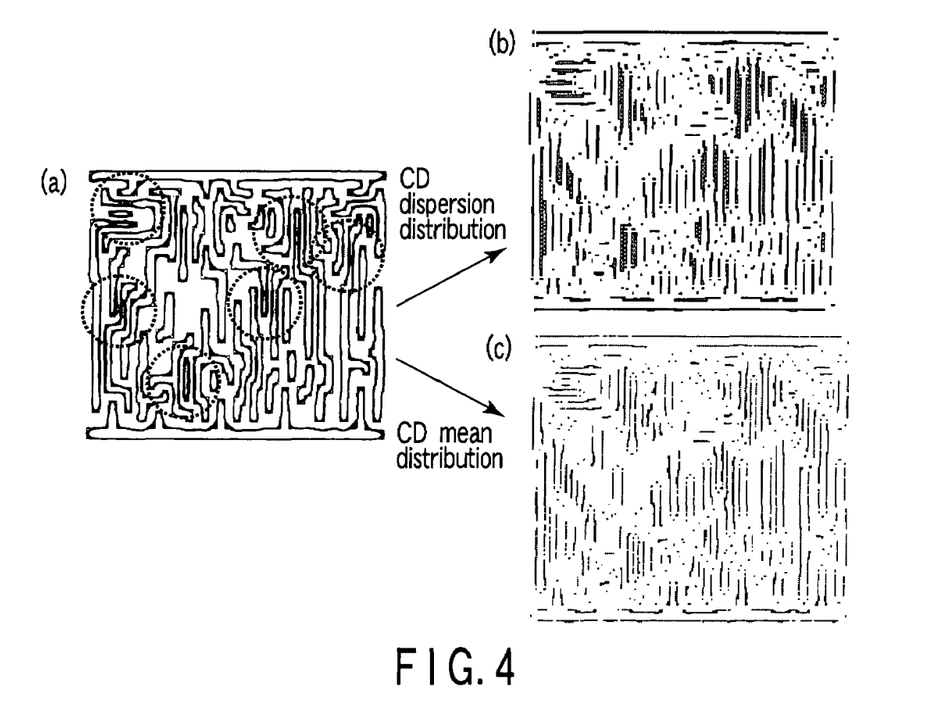
FIG. 4 relates to a second embodiment, and is a view showing processed pattern shape, dispersion distribution and mean distribution.

Under the process condition that the minimum pattern width is 63 nm, and k1=0.3, exposure dose and focus value are varied, and then, a processed pattern shape on a wafer was calculated. More specifically, three (3) conditions are given as the exposure dose, and two (2) conditions were given as the focus. Then, a processed pattern shape was calculated with respect to each of 6 (=3×2) conditions. FIG. 4(a) is a view showing a state that these processed pattern shapes are overlapped. In FIG. 4(a), a hot spot such that an open/short error is predicted appears in portions surrounded by a circle.

Two values were calculated from the result shown in FIG. 4(a). FIG. 4(b) shows a distribution of the difference (dispersion) between maximum and minimum values of dimension shift generated under the foregoing six (6) conditions. FIG. 4(c) shows a distribution of means of the dimension shift generated under the foregoing six conditions. In FIG. 4(b), large error generated portions are weak in variations of focus or exposure dose. In these portions, it is difficult to prevent the error even if OPC is optimized.

The OPC is a technique of determining a mask correction value so that a processed pattern shape on a wafer coincides with a desired target pattern under specific focus and exposure does conditions. In other words, the OPC is not a technique of making large focus and exposure does margins (called solo margin) inherent in the pattern. Thus, processing (corresponding to resizing in the first embodiment) for changing the OPC condition is not carried out with respect to the preceding portions, but the following processing should be carried out. That is, processing for modifying the design layout (processing for increasing pattern pitch, line width or space width, corresponding to "shift" in the first embodiment) is carried out to increase the lithography margin.

Considering the foregoing description, the hot spot is largely classified into two cases. One is the case where the solo margin is small. In this case, the dimensional variations (dispersion) of pattern are large resulting from variations of the exposure dose or focus. Another is the case where the solo margin is large, but the OPC is not optimized; for this reason, a common portion (common margin) of the solo margin is small. In this case, the mean of the pattern dimension greatly shifts from the design pattern resulting from variations of the exposure dose or focus. The former hot spot is repaired using design layout repair by "shift" of enlarging the pattern pitch. The latter hot spot is repaired using design layout repair of optimizing the OPC or "resizing" of enlarging the pattern dimension.

Figure 5A:
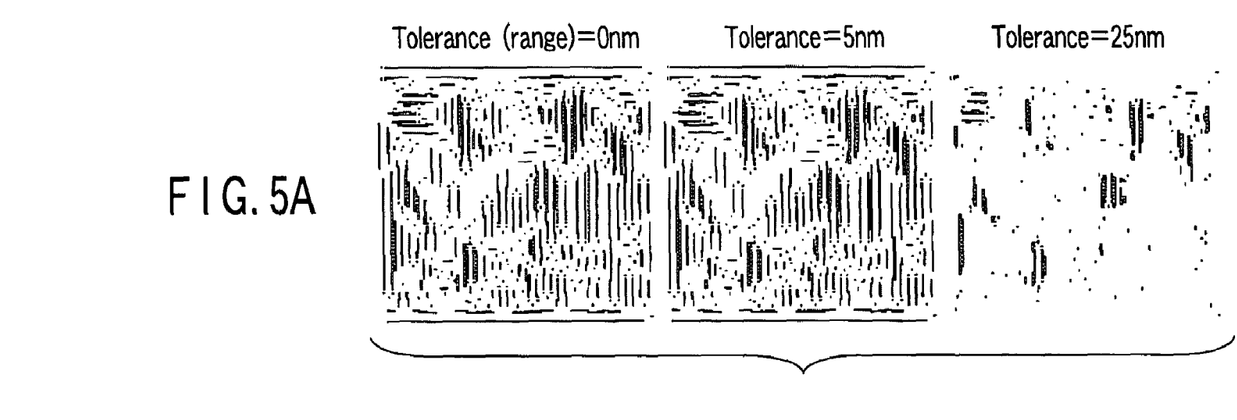
FIG. 5A and FIG. 5B are views showing an example of error determination made in accordance with tolerance.
Figure 5B:
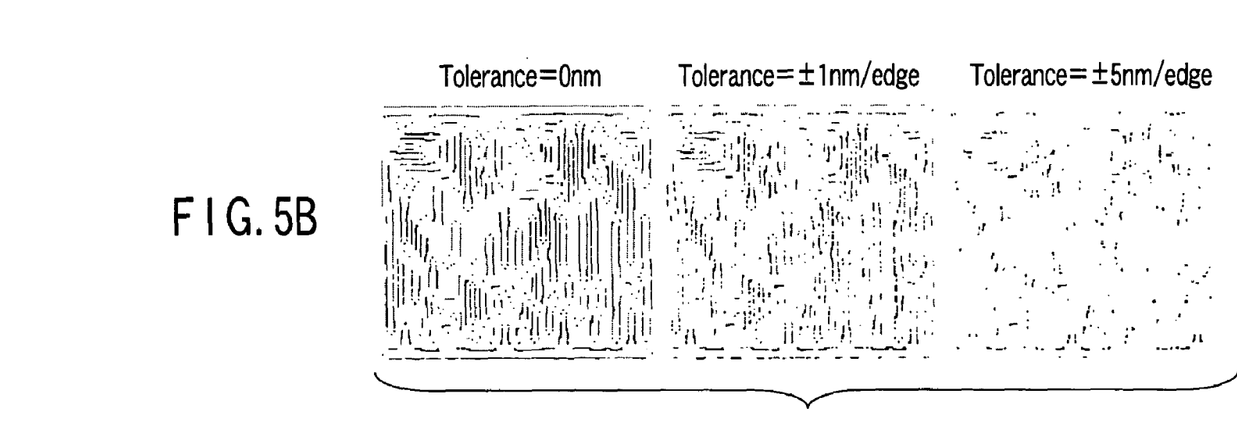

In fact, it is very important to provide a tolerance (process spec) for determining a range (value) regarded as an error. FIG. 5A is a view showing a dispersion distribution (CD error dispersion distribution) when the tolerance of dispersion is varied. FIG. 5B is a view showing a mean distribution (CD error mean distribution) when the tolerance of mean is varied. FIG. 5A and FIG. 5B correspond to FIG. 4(b) and FIG. 4(c), respectively. As seen from FIG. 5A and FIG. 5B, the tolerance value is changed, and thereby, the number of dispersion errors and the number of mean errors are both largely variable. The tolerance is a value determined according to device characteristic and process characteristic, and it is determined whether or not the pattern is regarded as an error in accordance with the tolerance value. Accordingly, tolerance setting is very important.

According to the foregoing method, dispersion error and mean error are classified, and a repair guideline is generated in accordance with the classified result.

Figure 6A:
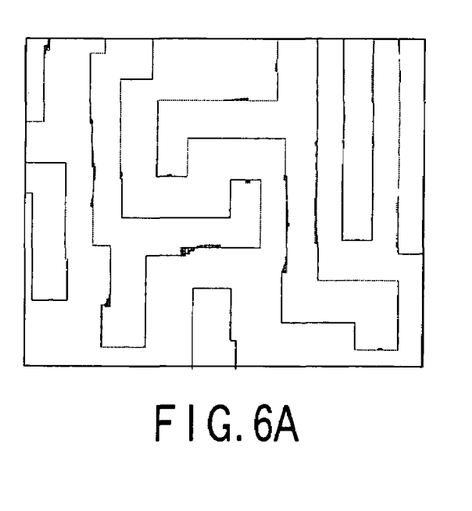
FIG. 6A and FIG. 6B are views showing an example of design layout correction.
Figure 6B:
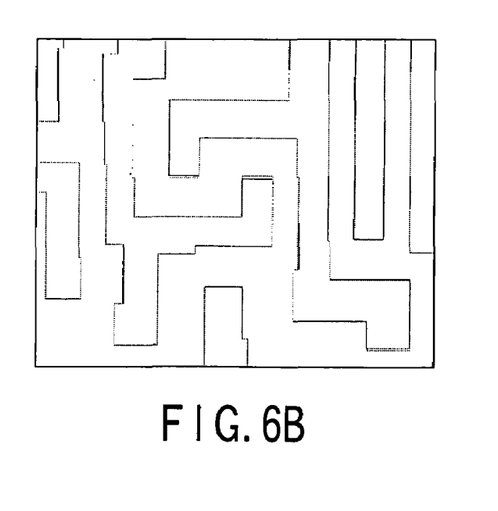

FIG. 6A is a view showing a mean error with respect to a design pattern. Base on the state shown in FIG. 6A, mean error amount and direction are generated as the repair guideline. Based on the generated repair guideline, the compaction tool generates a new design layout. As a result, a repaired design pattern shown in FIG. 6B is obtained. In FIG. 6A and FIG. 6B, an edge of an error generated portion is moved in a direction opposite to the error direction. The movement amount corresponds to the error amount. In addition to the error amount, the movement amount may be determined considering the pattern width or space width between patterns.

The foregoing first and second embodiments have been described presuming the photolithography process. The same method as the design layout preparing method describe above is applicable to X-ray exposure and electron beam (EB) exposure. In this case, parameters giving an influence to the processed pattern shape in these exposures are included in process parameter. In particular, EB exposure by direct writing has the following two cases. One is the case where a mask pattern line width is modified to carry out a dimension control. Another is the case where EB exposure does irradiated onto a wafer is adjusted to carry out a dimension control. Thus, parameters are variable in accordance with exposure method.

Figure 7:
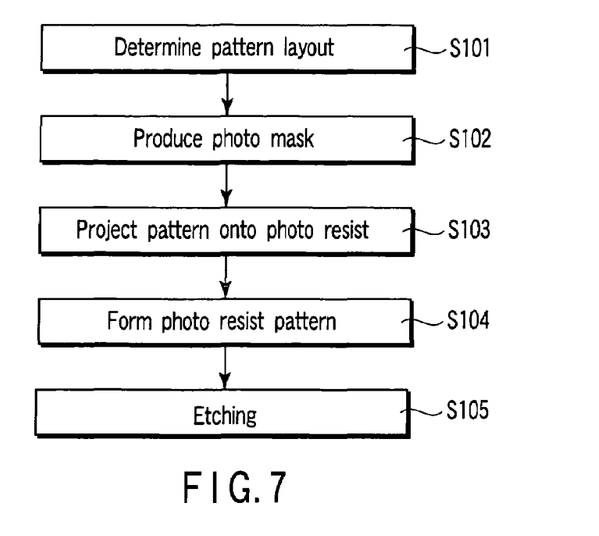
FIG. 7 is a flowchart to explain a method of manufacturing a mask and a method of manufacturing a semiconductor device.

A mask pattern based on the design layout prepared according to the method of the first and second embodiments is formed on a mask substrate, and thereby, a photo mask is produced. A semiconductor device (semiconductor integrated circuit) is manufactured using the mask pattern formed on the mask substrate. FIG. 7 is a flowchart to explain the foregoing methods.

The final pattern layout (design layout) is determined according to the method of the first or second embodiment (S101). Thereafter, a mask pattern is formed on a mask substrate based on the finally determined pattern layout, and thereby, a photo mask is produced (S102). The mask pattern on the photo mask is projected onto photo resist on a wafer (semiconductor substrate) (S103). Further, the photo resist is developed to form a photo resist pattern (S104). Conductive or insulating film is etched using the formed photo resist pattern as a mask, and thereby, a desired pattern is formed (S105).

As described above, the mask pattern and the semiconductor device are manufactured based on the design layout prepared according to the method of the first and second embodiments. By doing so, it is possible to obtain a mask and semiconductor device having a layout reduced as compared with the conventional case.

The procedures of the method of the first and second embodiments are realized using a computer, whose operation is controlled according to a program describing the procedures of the method. The program is provided via a recording medium such as a magnetic disk or communication network (wired or wireless line) such as Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of producing a design layout by optimizing at least one of a design rule, process proximity correction parameter and process parameter, the method comprising:
    calculating a processed pattern shape based on a design layout and a process parameter, the processed pattern shape being a pattern shape formed on a wafer by a lithography process or an etching process, and the process parameter being a parameter that influences the pattern shape formed on the wafer;
    extracting a dangerous spot having an evaluation value that does not satisfy a predetermined tolerance, the evaluation value including a difference between a target pattern shape and the processed pattern shape;
    generating a repair guideline for repairing the design layout based on a pattern included in the dangerous spot; and
    repairing a portion of the design layout that corresponds to the dangerous spot based on the repair guideline.

2. The method according to claim 1, wherein calculating the processed pattern shape includes calculating a plurality of processed pattern shapes using a plurality of process parameters, and the evaluation value includes at least one of mean and dispersion of differences between the target pattern shape and the processed pattern shapes.

3. The method according to claim 2, wherein the predetermined tolerance includes at least one of a tolerance with respect to the mean and a tolerance with respect to the dispersion.

4. The method according to claim 3, wherein the repair guideline defines position and layout repair method with respect to the dangerous spot, and the repair method is different between a case where the evaluation value does not satisfy the tolerance with respect to the mean and a case where the evaluation value does not satisfy the tolerance with respect to the dispersion.

5. The method according to claim 1, wherein the evaluation value includes at least one of dimension, area and peripheral length differences between the target pattern shape and the processed pattern shape.

6. The method according to claim 1, wherein the repair guideline defines position and layout repair information with respect to the dangerous spot, and the layout repair information includes at least one of layout repair amount, layout repair direction, layout repair method and layout repair target portion.

7. The method according to claim 1, wherein the process parameter includes at least one of parameters relevant to exposure system, lithography process, mask process and etching process.

8. The method according to claim 7, wherein the parameter relevant to the exposure system includes at least one of wavelength of illumination light, numerical aperture of lens, illumination shape, intensity distribution of illumination light, aberration of lens, exposure dose on a wafer, focus position, and light transmittance distribution of lens.

9. The method according to claim 7, wherein the parameter relevant to the lithography process includes a diffusion length of acid contained in resist.

10. The method according to claim 7, wherein the parameter relevant to the mask process includes variations of a mask pattern dimension resulting from mask process.

11. The method according to claim 7, wherein the parameter relevant to the etching process includes variations of a pattern dimension resulting from etching process.

12. The method according to claim 1, wherein extracting the dangerous spot includes extracting a plurality of dangerous spots, and the procedures from calculating the processed pattern shape to repairing that portion of the design layout which corresponds to the dangerous spot are repeated until the number of extracted dangerous spots becomes less than a predetermined number.

13. A method of manufacturing a mask, comprising: forming a mask pattern based on the design layout obtained by the method according to claim 1 on a mask substrate.

14. A method of manufacturing a semiconductor device, comprising:
    projecting the mask pattern obtained by the method according to claim 13 onto a photo resist on the wafer.

15. A system for producing a design layout by optimizing at least one of design rule, process proximity correction parameter and process parameter, the system comprising:
    a calculating part calculating a processed pattern shape based on a design layout and a process parameter, the processed pattern shape being a pattern shape formed on a wafer by a lithography process or an etching process, and the process parameter being a parameter that influences the pattern shape formed on the wafer;

an extracting part extracting a dangerous spot having an evaluation value that does not satisfy a predetermined tolerance, the evaluation value including a difference between a target pattern shape and the processed pattern shape;

a generating part generating a repair guideline for repairing the design layout based on a pattern included in the dangerous spot; and a repairing part repairing a portion of the design layout that corresponds to the dangerous spot based on the repair guideline.

16. A computer readable medium configured to store program instructions applied to producing a design layout by optimizing at least one of a design rule, process proximity correction parameter and process parameter, the program instructions causing a computer to calculate a processed pattern shape based on a design layout and a process parameter, the processed pattern shape being a pattern shape formed on a wafer by a lithography process or an etching process, and the process parameter being a parameter that influences the pattern shape formed on the wafer;

causing a computer to extract a dangerous spot having an evaluation value that does not satisfy a predetermined tolerance, the evaluation value including a difference between a target pattern shape and the processed pattern shape;

causing a computer to generate a repair guideline for repairing the design layout based on a pattern included in the dangerous spot; and causing a computer to repair a portion of the design layout that corresponds to the dangerous spot based on the repair guideline.

* * * * *